United States Patent
Wu

(10) Patent No.: US 9,425,759 B2
(45) Date of Patent: Aug. 23, 2016

(54) RECEIVER CIRCUIT AND GAIN CONTROLLING METHOD THEREOF

(71) Applicant: MONTAGE TECHNOLOGY (SHANGHAI) CO., LTD., Shanghai (CN)

(72) Inventor: Shunfang Wu, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 14/705,984

(22) Filed: May 7, 2015

(65) Prior Publication Data

US 2016/0211819 A1 Jul. 21, 2016

(30) Foreign Application Priority Data

Jan. 15, 2015 (CN) .......................... 2015 1 0021413

(51) Int. Cl.
*H04B 7/00* (2006.01)
*H03G 3/30* (2006.01)
*H04B 1/10* (2006.01)
*H03F 3/19* (2006.01)

(52) U.S. Cl.
CPC .............. *H03G 3/3036* (2013.01); *H03F 3/19* (2013.01); *H04B 1/109* (2013.01); *H03F 2200/451* (2013.01)

(58) Field of Classification Search
CPC ...................................................... H03G 3/3036
USPC ............................................ 455/253.2, 253.1
See application file for complete search history.

(56) References Cited

U.S. PATENT DOCUMENTS

2008/0130801 A1* 6/2008 Wang ................... H03G 3/3036
375/345
2015/0078429 A1* 3/2015 Chen ................. H04L 25/03159
375/232

* cited by examiner

*Primary Examiner* — Sanh Phu
(74) *Attorney, Agent, or Firm* — Jun He Law Offices P.C.; James J. Zhu

(57) ABSTRACT

There is disclosed a receiver circuit and a method for controlling gain in a receiver circuit. The receiver circuit includes a first amplifying stage, a mixer, a filter and a second amplifying stage. The receiver circuit further includes a first feedback loop coupled to the first amplifying stage and configured to generate a first gain control signal for controlling the first signal gain according to a first amplified signal, wherein the first feedback loop operates to maintain the strength of the first amplified signal at a first threshold. The receiver circuit further includes a threshold controller coupled to the first feedback loop, wherein the threshold controller is configured to generate a first threshold control signal for adjusting the first threshold.

29 Claims, 13 Drawing Sheets

RECEIVER CIRCUIT AND GAIN CONTROLLING METHOD THEREOF

CROSS REFERENCE TO RELATED APPLICATIONS

This application claims priority from Chinese Patent Application No. 201510021413.2 filed on Jan. 15, 2015, the entire content of which is incorporated herein by reference.

TECHNICAL FIELD

The application generally relates to radio-frequency circuit technology, and more particular to a receiver circuit and gain controlling method thereof.

BACKGROUND

A receiver system generally receives a radio-frequency (RF) signal, and converts the RF signal to an intermediate-frequency (IF) signal via its mixer and filter, which is further processed by post-stage circuit modules. FIG. 1 shows a conventional receiver circuit 10. As shown in FIG. 1, the receiver circuit 10 includes an RF amplifier 11, which has a gain $G_1$ that provides pre-selectivity gain to amplify an RF signal. A mixer 13 converts the RF signal to an IF signal. A filter 15 filters out-of-band signal. An IF amplifier 17 has a gain $G_2$ that provides post-selectivity gain to amplify the IF signal. Generally, the mixer 13 and the filter 15 may have limited linearity and noise performance, thus it is desirable to optimize the strength of signals that are coupled to them.

An input signal received by the receiver circuit generally includes channels at different frequencies. For a specific signal channel, the signal strength of a signal in an adjacent interference channel may be much higher than that of a signal in the desired channel, and the strength of the input signal may also change quickly. Thus, it is desirable that the receiver circuit could fast and automatically adjust its circuit gain in a wide range, so as to output a desired signal stably. Some automatic gain partitioning methods have been used in the receiver circuit 10 shown in FIG. 1.

FIG. 2 shows a conventional receiver circuit 20 with automatic gain control. As shown in FIG. 2, the circuit 20 uses an RF power detector 23 to detect the power of a signal outputted by an RF amplifier 21, and an RF gain controller 25 controls the gain of the RF amplifier 21 according to the detected power of the RF signal. Similarly, an IF power detector 29 detects the power of a signal outputted by the IF amplifier 27, and an IF gain controller 31 controls the gain of the IF amplifier 27 according to the detected power of the IF signal. However, when a high-strength interference signal is present outside the band of the desired signal, the circuit 20 may excessively decrease the gain of the RF amplifier 21 and excessively increase the gain of the IF amplifier 27, and as a result, the signal-to-noise ratio (SNR) of the circuit 20 may drop.

FIG. 3 shows another conventional receiver circuit 40 with automatic gain control. The circuit 40 only has an IF power detector 49 and an IF gain controller 51 coupled to an IF amplifier 47, and controls gain partitioning between an RF amplifier 41 and the IF amplifier 47 according to the detected power of an IF signal outputted by the IF amplifier 47. However, this method may excessively increase the RF gain of the RF amplifier 41, which increases distortion. In certain cases, all of the linearity margin of the system may be partitioned to the RF amplifier 41. The gain of the RF amplifier 41 may be configured to be a minimum gain that satisfies the predefined SNR required by post-stage circuit modules. As a result, the SNR of the output signal of the circuit may be maintained within a predefined range regardless how good the SNR of the input signal is, which constrains the best performance the receiver circuit may achieve.

FIG. 4 shows a further conventional receiver circuit 60 with automatic gain control. The circuit 60 has an RF power detector 63 coupled to an RF amplifier 61 and an IF power detector 69 coupled to an IF amplifier 67, respectively. The circuit 60 also has a gain partitioning controller 71 that controls the gain partitioning between the RF amplifier 61 and the IF amplifier 67 according to the detected power of the RF and IF signals. However, as the speed of detecting the IF power is much slower than that of detecting the RF power, this method leads to a slower response speed of the gain of the RF amplifier 61 to variances of the input signal of the RF amplifier 61. Moreover, if the output signal at the RF amplifier 61 is desired to have a wide adjustable range, the requirement of the dynamic range of the RF power detector is very high, which makes the receiver circuit 60 more complicated and difficult to be implemented.

Thus, there is a need for a receiver circuit to address the aforementioned defects of the conventional receiver circuits.

SUMMARY

In a first aspect of the application, there is provided a receiver circuit. The receiver circuit comprises a first amplifying stage having a first signal gain, the first amplifying stage being configured to receive an input signal and generate a first amplified signal; a mixer for converting the frequency of the first amplified signal; a filter for filtering the converted first amplified signal; a second amplifying stage having a second signal gain, the second amplifying stage being configured to receive the filtered first amplified signal and generate a second amplified signal; a first feedback loop coupled to the first amplifying stage and being configured to generate a first gain control signal for controlling the first signal gain according to the first amplified signal, wherein the first feedback loop operates to maintain the strength of the first amplified signal at a first threshold; and a threshold controller coupled to the first feedback loop, the threshold controller being configured to generate a first threshold control signal for adjusting the first threshold In certain embodiments, the first feedback loop comprises a first pre-amplifier having a first detection gain and configured to amplify the first amplified signal; a first signal detector configured to receive a first reference signal and detect a ratio of the first amplified signal amplified by the first pre-amplifier to the first reference signal to generate a first detection signal; a first gain controller configured to generate the first gain control signal according to the first detection signal; wherein the threshold controller is configured to generate the first threshold control signal according to the first threshold, the strength of the second amplified signal and the second signal gain, and wherein the first threshold control signal adjusts the first detection gain to adjust the first threshold.

In certain embodiments, the threshold controller is configured to generate the first threshold control signal that increases the first detection gain to decrease the first threshold, and generate the first threshold control signal that decreases the first detection gain to increase the first threshold.

In certain embodiments, the first feedback loop comprises a first signal detector configured to receive a first reference signal and detect a ratio of the first amplified signal to the first reference signal to generate a first detection signal; a first gain controller configured to generate a first gain control signal according to the first detection signal; wherein the threshold controller is configured to generate the first threshold control signal according to the first threshold, the strength of the second amplified signal and the second signal gain, and wherein the first threshold control signal adjusts the strength of the first reference signal to adjust the first threshold.

In certain embodiments, the threshold controller is configured to generate the first threshold control signal that decreases the strength of the first reference signal to decrease the first threshold, and generate the first threshold control signal that increases the first detection gain to increase the first threshold.

In certain embodiments, threshold controller is configured to adjust the first threshold to improve the signal to noise and distortion ratio (SNDR) of the second amplified signal.

In certain embodiments, the threshold controller is configured to determine the interference to signal ratio (ISR) of the first amplified signal, and adjust the first threshold according to a predetermined allowable ISR range corresponding to the first threshold.

In certain embodiments, the threshold controller is configured to decrease the first threshold to reduce the interference and distortion in the second amplified signal if the ISR of the first amplified signal is higher than an upper limit of the predetermined allowable ISR range, and increase the first threshold to increase the signal to noise ratio (SNR) of the second amplified signal if the ISR of the first amplified signal is lower than a lower limit of the predetermined allowable ISR range.

In certain embodiments, the threshold controller is configured to determine the ISR of the first amplified signal according to the first threshold, the strength of the second amplified signal and the second signal gain.

In certain embodiments, the threshold controller is further configured to determine the noise figure required by the receiver circuit, and determine whether to adjust the first threshold according to a predetermined allowable range of the first signal gain corresponding to the noise figure.

In certain embodiments, the noise figure required by the receiver circuit is determined by the following equation:

$$NF = 174 \text{ dBm/Hz} - 10 * lg\ B - SNR_{out\ min} + P_{sig}$$

wherein NF denotes the noise figure, B denotes the bandwidth of a desired signal, $SNR_{outmin}$ denotes the minimum SNR that can be processed by a post stage circuit of the receiver circuit, $P_{sig}$ denotes the strength of the desired signal of the input signal, and wherein $P_{sig}$ is determined by the first signal gain, the second signal gain and the second threshold.

In certain embodiments, the receiver circuit further comprises a second feedback loop coupled to the second amplifier and being configured to generate a second gain control signal for controlling the second signal gain according to the second amplified signal, the second feedback loop operates to maintain the strength of the second amplified signal at a second threshold.

In certain embodiments, the threshold controller is further configured to determine the ISR of the first amplified signal according to the first threshold, the second threshold and the second gain control signal, and adjust the first threshold according to a predetermined allowable ISR range corresponding to the first threshold.

In certain embodiments, the threshold controller is configured to decrease the first threshold to reduce the interference and distortion in the second amplified signal if the ISR of the first amplified signal is higher than an upper limit of the predetermined allowable ISR range, and increase the first threshold to increase the SNR of the second amplified signal if the ISR of the first amplified signal is lower than a lower limit of the predetermined allowable ISR range.

In certain embodiments, the second feedback loop comprises: a second pre-amplifier having a second detection gain and configured to amplify the second amplified signal; a second signal detector configured to receive a second reference signal, and configured to detect a ratio of the second amplified signal amplified by the second pre-amplifier to the second reference signal to generate a second detection signal; a second gain controller configured to generate a second gain control signal according to the second detection signal; wherein the threshold controller is further configured to generate the second threshold control signal according to the first threshold, the second threshold and the second gain control signal, thereby adjusting the second threshold by adjusting the second detection gain.

In certain embodiments, the second feedback loop comprises: a second signal detector configured to detect a second reference signal, and detect a ratio of the second amplified signal to the second reference signal to generate a second detection signal; a second gain controller configured to generate the second gain control signal according to the second detection signal; wherein the threshold controller is configured to generate the second threshold control signal according to the first threshold, the second threshold and the second gain control signal, thereby adjusting the second threshold by adjusting the strength of the second reference signal.

In certain embodiments, the first amplifying stage comprises one or more variable gain amplifiers, and the first gain control signal controls the gains of the one or more variable gain amplifiers to make the total gain of the first amplifying stage equal to the first signal gain.

In a second aspect of the application, there is provided a receiver circuit. The receiver circuit comprises a first amplifying stage having one or more variable gain amplifiers, the first amplifying circuit being configured to receive an input signal and amplify the input signal; a mixer configured to convert the frequency of the amplified signal amplified by the first amplifying stage; a filter configured to filter the converted signal; a second amplifying stage having one or more variable gain amplifiers, the second amplifying stage being configured to amplify the filtered signal; one or more feedback loop, wherein each feedback loop is coupled to one or more of the one or more variable gain amplifiers of the first and second amplifying stages, and configured to generate a gain control signal for controlling the variable gain amplifiers coupled thereto according to an output signal outputted at a last amplifier of the one or more variable gain amplifiers coupled thereto, and wherein each feedback loop operates to maintain the strength of the output signal at a predetermined threshold; and a threshold controller coupled to at least one of the one or more feedback loops and configured to generate a threshold control signal to adjust the predetermined threshold.

In certain embodiments, each feedback loop comprises a pre-amplifier having a detection gain and coupled to at the last amplifier of the one or more variable gain amplifiers coupled to the feedback loop, the pre-amplifier being configured to amplify the output signal amplified by the one or more variable gain amplifiers coupled to the feedback loop;

a signal detector configured to receive a reference signal, and configured to detect a ratio of a signal amplified by the pre-amplifier to the reference signal to generate a detection signal; a gain controller configured to generate the gain control signal according to the detection signal; wherein the threshold controller is configured to generate the threshold control signal according to the predetermined threshold and the gain control signal, and wherein the threshold control signal adjusts the detection gain to adjust the predetermined threshold.

In certain embodiments, the threshold controller is configured to generate the threshold control signal that increases the detection gain to decrease the predetermined threshold, and generate the threshold control signal that decreases the detection gain to increase the predetermined threshold.

In certain embodiments, each feedback loop comprises a signal detector configured to receive a reference signal, and configured to detect a ratio of the output signal amplified by the one or more variable gain amplifiers coupled to the feedback loop to the reference signal to generate a detection signal; a gain controller configured to generate the gain control signal according to the detection signal; wherein the threshold controller is configured to generate the threshold control signal according to the predetermined threshold and the gain control signal, and wherein the threshold control signal adjusts the strength of the reference signal to adjust the predetermined threshold.

In certain embodiments, the threshold controller is configured to generate the threshold control signal that decreases the strength of the reference signal to decrease the predetermined threshold, and generate the threshold control signal that increases the strength of the reference signal to increase the predetermined threshold.

In certain embodiments, the threshold controller is further configured to adjust the predetermined threshold corresponding to the first amplifying stage to increase the SNDR of the signal amplified by the second amplifying stage.

In certain embodiments, the threshold controller is configured to determine the SNR of the signal amplified by the first amplifying stage, and adjust the predetermined threshold corresponding to the signal amplified by the first amplifying stage according to a predetermined allowable ISR range corresponding to the predetermined threshold.

In certain embodiments, the threshold controller is configured to decrease the predetermined threshold to reduce the interference and distortion in the signal amplified by the second amplifying stage if the ISR of the signal amplified by the first amplifying stage is higher than an upper limit of the predetermined allowable ISR range, and increase the predetermined threshold to increase the SNR of the signal amplified by the second amplifying stage if the ISR of the signal amplified by the first amplifying stage is lower than a lower limit of the predetermined allowable ISR range.

In a third aspect of the application, there is provided a method for controlling gain in a receiver circuit. The method comprises amplifying an input signal with a first signal gain to generate a first amplified signal, wherein the first signal gain is controlled to maintain the strength of the first amplified signal at a first threshold; converting the frequency of the first amplified signal; filtering the converted first amplified signal; amplifying the filtered first amplified signal with a second signal gain to generate a second amplified signal, wherein the second signal gain is controlled to maintain the strength of the second amplified signal at a second threshold; and adjust the first threshold and/or the second threshold to improve the SNDR of the second amplified signal.

In a fourth aspect of the application, there is provided a method for controlling gain in a receiver circuit. The method comprises coupling one or more feedback loops to one or more amplifiers of an amplifying chain of the receiver circuit, wherein each feedback loop operates to maintain the strength of a signal amplified by the amplifier coupled thereto at a predetermined threshold; and adjusting the predetermined threshold to improve the SNDR of an output signal outputted by the amplifying chain.

For the receiver circuits and methods for controlling gain in receiver circuits according to embodiments of the application, the gain control for each amplifier stage in an amplifier chain of the receiver circuit is closed-loop control. Moreover, the strength or power of signals in the amplifying chain can be controlled more precisely, compared with the conventional receiver circuits where the power of signal is detected at the last amplifier stage and the gain of the frontend amplifier is adjusted accordingly. For the conventional receiver circuits, the filter may filter out many out-of-band signals that can not be detected by the power detector at the last stage of the amplifying chain, and thus, the gain partitioning of the amplifiers can not assure that the power of signals at the stages subsequent to the filter is as precise as the power of signals at the input node of the filter. The receiver circuits and the methods of the application prevent this happening such that they can achieve better precision.

In certain conditions, the threshold at each stage of the receiver circuits of the application is adjusted by adjusting the detection gain of the pre-amplifier of the feedback loop. As the detection gain of the pre-amplifier can be adjusted very fast, the threshold adjustment can be achieved fast.

The foregoing and other advantages and features of the application, and the manner in which the same are accomplished, will become more readily apparent upon consideration of the following detailed description of the application taken in conjunction with the accompanying examples, which illustrate preferred and exemplary embodiments.

BRIEF DESCRIPTION OF THE DRAWINGS

The aforementioned features and other features of the application will be further described in the following paragraphs by referring to the accompanying drawings and the appended claims. It will be understood that, these accompanying drawings merely illustrate some embodiments in accordance with the present application and should not be considered as limitation to the scope of the present application. Unless otherwise specified, the accompanying drawings need not be proportional, and similar reference characters generally denote similar elements.

DETAILED DESCRIPTION OF THE PREFERRED EMBODIMENTS

The following detailed description refers to the accompanying drawings as a part of the present application. The illustrative embodiments described in the detailed description, the accompanying drawings and the claims are not limiting, and other embodiments may be adopted, or modifications may be made without deviating from the spirit and subject of the application. It should be understood that, the various aspects of the application described and graphically presented herein may be arranged, replaced, combined, divided and designed in many different configurations, and these different configurations are explicitly included in the application.

Figure 1:
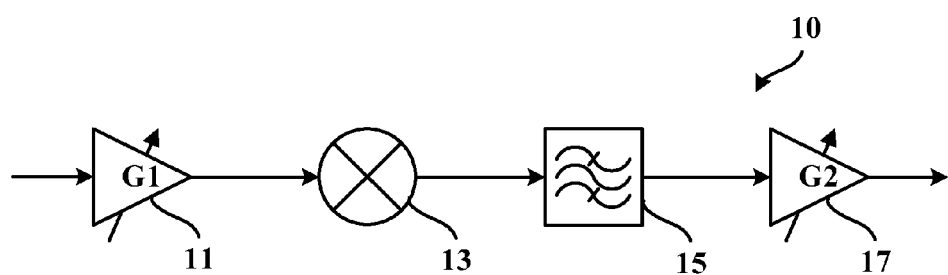
FIG. 1 shows a conventional receiver circuit.
Figure 2:
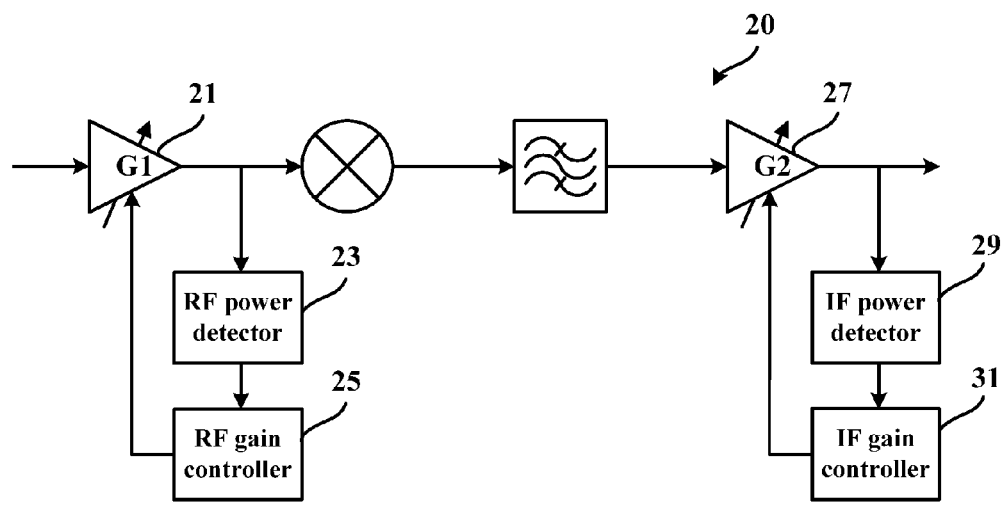
FIG. 2 shows a conventional receiver circuit with automatic gain control.
Figure 3:
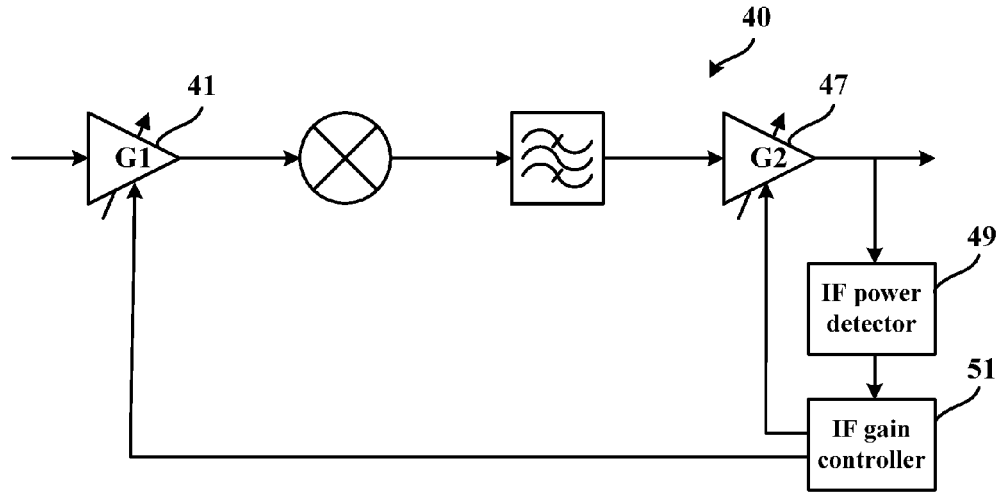
FIG. 3 shows another conventional receiver circuit with automatic gain control.
Figure 4:
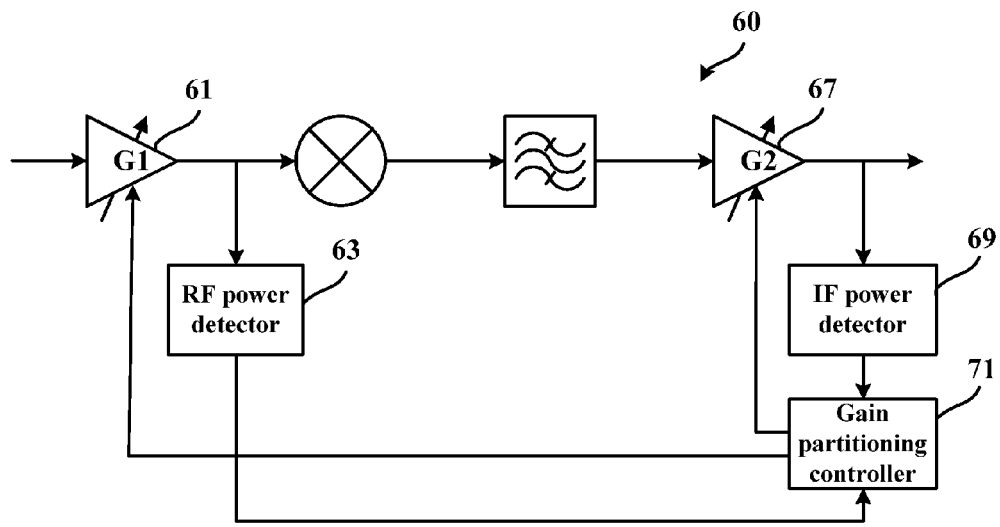
FIG. 4 shows a further conventional receiver circuit with automatic gain control.
Figure 5:
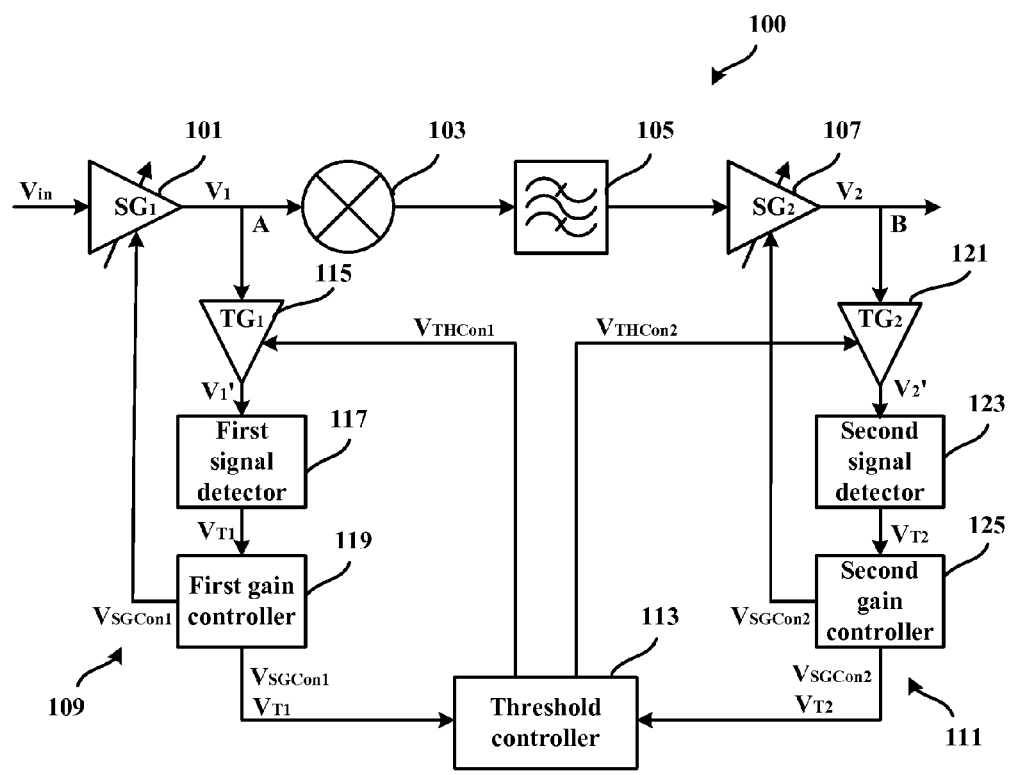
FIG. 5 shows a receiver circuit according to an embodiment of the application.

FIG. 5 shows a receiver circuit 100 according to an embodiment of the present application.

As shown in FIG. 5, the receiver circuit 100 has a first amplifying stage 101, a mixer 103, a filter 105 and a second amplifying stage 107. The first amplifying stage 101 has a variable first signal gain $SG_1$. The first amplifying stage 101 receives a high-frequency input signal $V_{in}$, and amplifies the input signal $V_{in}$ with the first signal gain $SG_1$ to generate a first amplified signal $V_1$. The first amplifying stage 101 has a gain control node, and it adjusts the first signal gain $SG_1$ in response to a signal received at its gain control node. The mixer 103 converts the frequency of the first amplified signal $V_1$. The receiver circuit 100 also includes a local oscillator (not shown) that provides a local oscillating signal to the mixer 103 to help the frequency conversion of the first amplified signal $V_1$. The filter 105 filters the converted first amplified signal $V_1$ to filter out high-frequency interference therefrom. In certain embodiments, the filter 105 is a bandpass or lowpass filter. The second amplifying stage 107 has a variable second signal gain $SG_2$. The second amplifying stage 107 receives the filtered first amplified signal $V_1$ output from the filter 105, and amplifies the filtered first amplified signal $V_1$ to generate a second amplified signal $V_2$. The second amplifying stage 107 has a gain control node, and it adjusts the second signal gain $SG_2$ in response to a signal received at its gain control node.

It would be appreciated that the amplifying stages, amplifiers and similar signal amplifying elements may have signal gains greater than 1, i.e. increase the strength of the signals, or may have signal gains equal to or less than 1, i.e. maintain or decrease the strength of the signals.

The receiver circuit 100 also has a first feedback loop 109 coupled to the first amplifying stage 101. Specifically, the first feedback loop 109 is coupled between the output node and the gain control node of the first amplifying stage 101.

The first amplifying stage 109 receives a first amplified signal $V_1$, and according to the first amplified signal $V_1$, generates a first gain control signal $V_{SGCon1}$ for controlling the first signal gain $SG_1$. With the first feedback loop 109, the first amplifying stage 101 is configured as an automatic gain control (AGC) amplifying circuit that operates to maintain the strength of the first amplified signal $V_1$ at a first threshold $TH_1$. It would be readily appreciated that the strength of the signals of the receiver circuit 100 including the first amplified signal V1 may be expressed in forms of power, voltage or current. A specific form could be chosen by people skilled in the art according to actual applications. Hereinafter, the strength of signals, the first threshold $TH_1$ or the other thresholds are all expressed in form of power. However, people skilled in the art would appreciate revising the expression form thereof, for example, expressing such in voltages.

Similarly, the receiver circuit 100 also includes a second feedback loop 111 coupled to the second amplifying stage 107. Specifically, the second feedback loop 111 is coupled between the output node and the gain control node of the second amplifying stage 107. The second feedback loop 111 receives the second amplified signal $V_2$, and according to the second amplified signal $V_2$, generates a second gain control signal $V_{SGCon2}$ for controlling the second signal gain $SG_2$. With the second feedback loop 111, the second amplifying stage 107 is configured as an AGC amplifying circuit that operates to maintain the strength of the second amplified signal $V_2$ at a second threshold $TH_2$.

The receiver circuit 100 also includes a threshold controller 113, which is coupled to the first feedback loop 109 and the second feedback loop 111 to set the first threshold $TH_1$ and/or the second threshold $TH_2$, respectively. The SNDR of the second amplified signal $V_2$ may be improved by properly setting the first threshold $TH_1$ and/or the second threshold $TH_2$. During the operation of the receiver circuit 100, in certain embodiments, it is required that the second amplified signal $V_2$ output by the receiver circuit 100 has a relatively constant strength such that it could be further processed by post-stage signal processing circuits, e.g., an analog-to-digital convertor. In this condition, the second threshold $TH_2$ can be configured as a constant value and only the first threshold $TH_1$ is adjustable. For the signal amplifying chain of the receiver circuit 100, the strength of the first amplified signal $V_1$ mainly depends on a signal component thereof from an interference channel. Therefore, the threshold controller 113 setting the strength of the first amplified signal $V_1$ at the first threshold $TH_1$ keeps the strength of the interference signal at the first threshold $TH_1$. When the first threshold $TH_1$ is relatively low, the amplitude of the signal input to the mixer 103 is relatively low. This loosens the linearity requirement of the mixer 103 and the filter 105 and thus reduces the distortion in the second amplified signal $V_2$. When the first threshold $TH_1$ is relatively high, the strength of the interference signal component of the first amplified signal $V_1$ is relatively high. When the amplified signal is passed through the mixer 103 and the filter 105, nonlinear distortion occurs such that the distortion of the output second amplified signal $V_2$ increases. Therefore, it is generally desired to set the first threshold $TH_1$ within an appropriate range to trade off between distortion and noise, such that the output second amplified signal $V_2$ may have a better SNDR performance. It would be appreciated that the strengths of the interference signal component and the desired signal component of the input signal $V_{in}$ may vary with the strength of the input signal $V_{in}$, and thus the value of the first threshold $TH_1$ that optimize the SNDR performance of the second amplified signal $V_2$ may vary accordingly.

As mentioned above, the second amplified signal $V_2$ may have constant strength in some scenarios. Thus, in certain embodiments, the second threshold $TH_2$ may be set to a constant value, and the threshold controller 113 may not provide the threshold control signal that changes the second threshold $TH_2$ to the second feedback loop 111.

Similarly, in certain embodiments, the first threshold $TH_1$ may be set to a constant value while the second threshold $TH_2$ is adjustable. Accordingly, the threshold controller 113 is coupled to the second feedback loop 111 to set the second threshold $TH_2$, and does not provide the threshold control signal for adjusting the first threshold $TH_1$.

In the embodiment shown in FIG. 5, the first feedback loop 109 has a first pre-amplifier 115, a first signal detector 117 and a first gain controller 119. Specifically, the first pre-amplifier 115 amplifies the first amplified signal $V_1$ with a first detection gain $TG_1$ that is adjustable. After amplified by the first pre-amplifier 115, the strength of the first amplified signal $V_1$ changes to $V_1'$, as is shown in FIG. 5. The first signal detector 117 further receives a first reference signal $V_{Ref1}$, and detects the ratio of the first amplified signal $V_1'$ after amplified by the first pre-amplifier 115 to the first reference signal $V_{Ref1}$ to generate a first detection signal $V_{T1}$.

In certain embodiments, the first signal detector 117 may be a comparator using the first reference signal $V_{Ref1}$ as its reference, which compares whether the signal $V_1'$ is greater than the first reference signal $V_{Ref1}$. When the signal $V_1'$ is smaller than the first reference signal $V_{Ref1}$, the first detection signal $V_{T1}$ generated by the comparator indicates the comparison result accordingly. The first gain controller 119 generates a first gain control signal $V_{SGCon1}$ that increases the first signal control $SG_1$ according to a comparison result that the signal $V_1'$ is smaller than the first reference signal in strength, thereby the first amplifying stage 101 amplifies the strength of the first amplified signal $V_1$. The strength of the signal $V1'$ increases accordingly until substantially equals to that of the first reference signal $V_{Ref1}$. When the signal $V_1'$ is larger than the first reference signal $V_{Ref1}$ in strength, the first signal gain is decreased so that the first amplifying stage 101 decreases the strength of the first amplified signal $V_1$. By doing so, the strength of the signal $V_1'$ is maintained to be substantially equal to that of the reference signal $V_{Ref1}$, and the strength of the first amplified signal $V_1$ is maintained to be equal to $V_{Ref1}/TG_1$. In another word, $V_{Ref1}/TG_1$ corresponds to the first threshold $TH_1$.

In some other embodiments, the first signal detector 117 may be an analog-to-digital (A/D) converter using the first reference signal $V_{Ref1}$ as its reference. The A/D converter may include a voltage dividing network (e.g. a resistive voltage dividing network), which converts the first reference signal $V_{Ref1}$ into a plurality of quantized voltage levels with variable steps. The A/D converter further includes a plurality of comparators corresponding to the quantized voltage levels, which compares the signal $V_1'$ with the quantized voltage levels and generates a first detection signal $V_{T1}$ indicating the relative strength of the signal $V_1'$ in digital format such as a 2-bit, 3-bit or n-bit binary number. Furthermore, the first gain controller 119 generates a first gain control signal $V_{SGcon1}$ for adjusting the first signal gain $SG_1$ according to the digital first detection signal $V_{T1}$. By doing so, the strength of the signal $V_1'$ is maintained to be in a predefined proportion to that of the reference signal $V_{Ref1}$, e.g. substantially equal to that of the reference signal $V_{Ref1}$, and the strength of the first amplified signal $V_1$ is maintained to be equal to $V_{Ref1}/TG_1$. In another word, $V_{Ref1}/TG_1$ roughly corresponds to the first threshold $TH_1$.

In the embodiment shown in FIG. 5, the threshold controller 113 receives the first detection signal $V_{T1}$ and the first gain control signal $V_{SGcon1}$, and generates a first threshold control signal $V_{THCon1}$ according to the first threshold $TH_1$, the second threshold $TH_2$ and the second gain control signal $V_{SGCon2}$. In certain embodiments, the first threshold control signal $V_{THCon1}$ is provided to the first pre-amplifier 115 to adjust the first detection gain $TG_1$. From the foregoing, the strength of the signal $V_1'$ that is compared to the first reference signal $V_{Ref1}$ may not change, thus the change in the first detection gain $TG_1$ may change the strength of the first amplified signal $V_1$, that is, changes the first threshold $TH_1$. Specifically, the threshold controller 113 decreases the first threshold $TH_1$ by increasing the first detection gain $TG_1$, and increases the first threshold $TH_1$ by decreasing the first detection gain $TG_1$. For example, where the first detection gain $TG_1$ increases by 10 dBm, the first threshold $TH_1$ decreases by 10 dBm.

In some applications, the threshold controller 113 may determine the ISR of the first amplified signal $V_1$, i.e. the ratio of power of the interference signal to the desired signal in the first amplified signal $V_1$. For example, the threshold controller 113 may determine the ISR of the first amplified signal $V_1$ according to the present value of the first threshold $TH_1$, the second threshold $TH_2$, and the second gain control signal $V_{SGCon2}$. Furthermore, the threshold controller 113 may adjust the first threshold $TH_1$ according to a predetermined allowable ISR range corresponding to the first threshold $TH_1$. After the adjustment, the ISR of the first amplified signal $V_1$ should be within the allowable ISR range. In particular, the first threshold $TH_1$ may have different values, each of which corresponds to an allowable ISR range. In another word, for a specific value of the first threshold $TH_1$, the second amplified $V_2$ may have a relatively good SNDR performance when the ISR of the first amplified signal $V_1$ is within certain range. In contrast, the second amplified signal $V_2$ may have excess distortion or noise when the ISR of the first amplified signal $V_1$ is out of the range.

Figure 14:
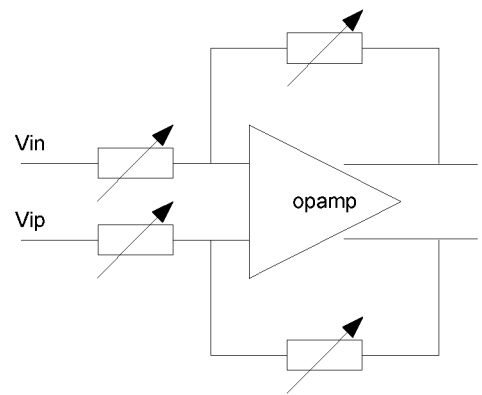
FIG. 14 shows an exemplary circuit of a first pre-amplifier and a second pre-amplifier in FIG. 5.
Figure 15:
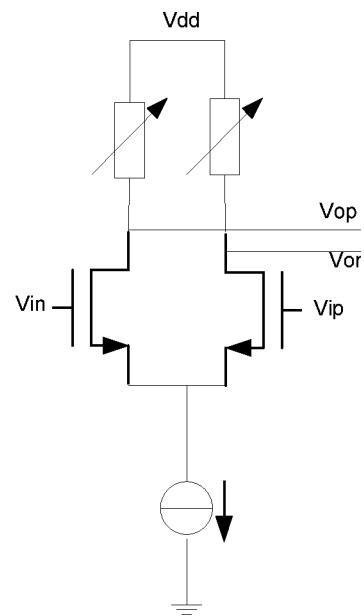
FIG. 15 shows another exemplary circuit of a first pre-amplifier and a second pre-amplifier in FIG. 5.

It should be noted that the first amplifying stage 101 and the second amplifying stage 107 are shown to include a single variable gain amplifier in the embodiment shown in FIG. 5. However, in other embodiments, the first amplifying stage 101 may include multiple variable gain amplifiers. Accordingly, the first gain control signal $V_{SGCon1}$ may include multiple sub-signals to control the multiple variable gain amplifiers, respectively, thereby the total gain of the first amplifying stage 101 is equal to the first signal gain $SG_1$. Similarly, the second amplifying stage 107 may include multiple variable gain amplifiers. Accordingly, the second gain control signal $V_{SGCon2}$ may include multiple signal components to control the multiple variable gain amplifiers, respectively, thereby the total gain of the second amplifying stage is equal to the second signal gain $SG_2$. Each of the variable gain amplifiers may be an open loop amplifier shown in FIG. 14, or a closed loop amplifier shown in FIG. 15. Moreover, each variable gain amplifier may be coupled with a feedback loop that generates a gain control signal for controlling the gain of the variable gain amplifier coupled thereto according to the strength of the signal output by the variable gain amplifier, and each feedback loop operates to maintain the strength of the signal output by the variable gain amplifier coupled thereto at a predetermined threshold. In some embodiments, a feedback loop may be coupled to one or more variable gain amplifiers to control the gain of the variable gain amplifiers coupled thereto.

Accordingly, the threshold controller may be coupled to these feedback loops and generates threshold signals for adjusting the predetermined thresholds.

Figure 6:
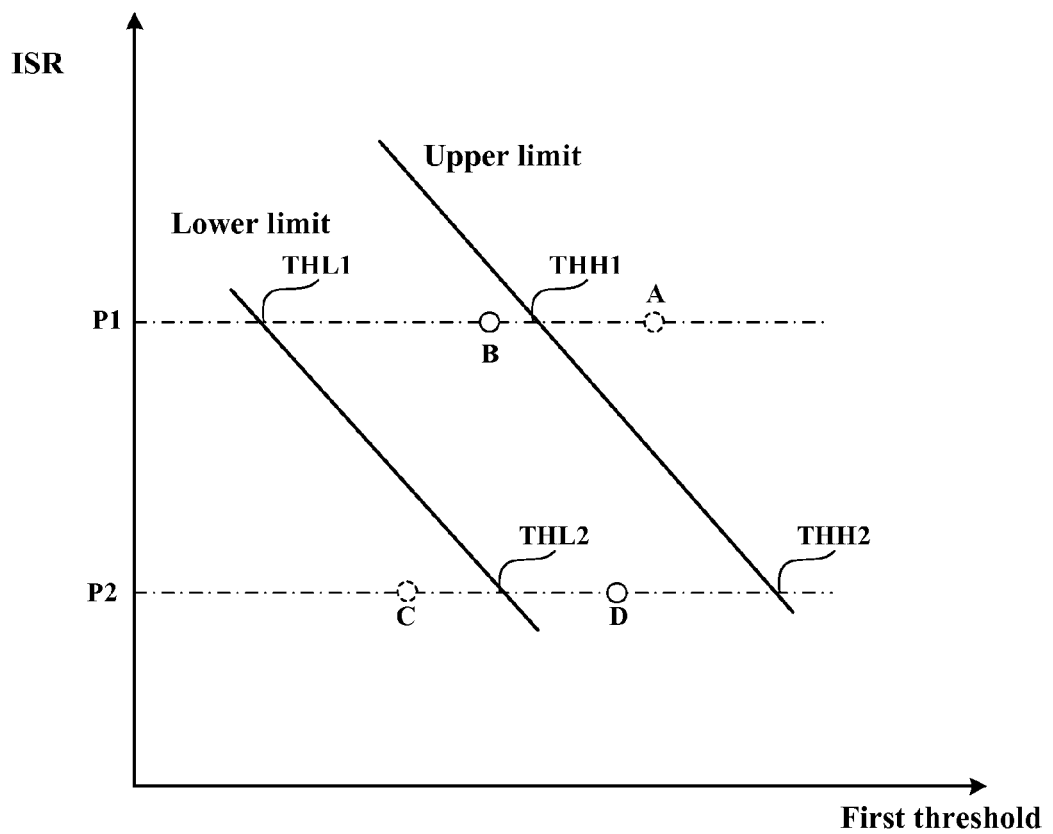
FIG. 6 shows an allowable ISR range of a first amplified signal varying with a first threshold.

FIG. 6 shows an allowable ISR range of the first amplified signal changing with a first threshold. In applications, the relationship between the allowable ISR range and the first threshold may be determined by experimental data.

As shown in FIG. 6, for each first threshold, the allowable ISR range has an upper limit and a lower limit. Thus, the region between an upper limit curve and a lower limit curve shown in FIG. 6 defines the allowable ISR range. Accordingly, each ISR also corresponds to a certain allowable range of the first threshold. Thus, the first threshold may be adjusted according to the allowable ISR range corresponding to the first threshold, or equivalently, according to the allowable range of the first threshold corresponding to the ISR.

For example, an ISR value P1 corresponds to an allowable first threshold range [THL1, THH1], while another ISR value P2 corresponds to another allowable first threshold range [THL2, THH2]. When the threshold controller determines that the first amplified signal is at position A, its first threshold is out of the allowable range [THL1, THH1]. In another word, at position A, the ISR of the first amplified signal is greater than an upper limit P1' of the allowable range. Accordingly, the threshold controller decreases the first threshold to move the first amplified signal to position B. At position B, the ISR of the first amplified signal does not change but the first threshold is within its allowable range [THL1, THH1]. The decreased first threshold at position B can reduce the distortion in the second amplified signal. Furthermore, when the threshold controller determines that the first amplified signal is at position C, the first threshold is out of the allowable range [THL2, THH2]. In another word, at position C, the ISR of the first amplified signal is lower than a lower limit P2' of the allowable range. Accordingly, the threshold controller increases the first threshold to move the first amplified signal to position D. At position D, the ISR of the first amplified signal does not change but the first threshold is within its allowable range [THL2, THH2]. The increased first threshold at position D can increase the SNR of the second amplified signal.

In certain embodiments, the post-stage circuits of the receiver circuit 100 may have a certain requirement on the SNR of the second amplified signal $V_2$ that the SNR should not be lower than a minimum value that the post-stage circuits can process. According to certain parameters including the SNR requirement and the strength of the desired signal component in the input signal $V_{in}$, the noise figure allowed by the receiver circuit can be determined, i.e. the required noise figure. The bigger the noise figure is, the worse the noise performance of the amplifying chain of the receiver circuit is. The requirement of the receiver circuit on the noise figure may influence the adjustment of the first threshold.

Specifically, the receiver circuit 100 may determine the strength of the second amplified signal $V_2$ output at its output node, i.e. the second threshold, and further determine the maximum noise figure according to the bandwidth of the desired signal and the minimum SNR that the post stage circuits can process. The noise figure is given by the following equation:

$$NF = 174 \text{ dBm/Hz} - 10 * lg\, B - SNR_{out\ min} + P_{sig}$$

herein NF denotes the noise figure, B denotes the bandwidth of the desired signal, $SNR_{outmin}$ denotes the minimum SNR that the post-stage circuits can process, $P_{sig}$ denotes the strength of the desired signal in the input signal. $P_{sig}$ may be determined by subtracting the sum of the first signal gain and the second signal gain from the second threshold.

From the foregoing, the noise figure may have a corresponding allowable range for different strength of input desired signal. The allowable noise figure range may be determined by simulation and experiments under various gain combinations of the amplifying chain of the receiver circuit. In another word, a lookup table associating the noise figure with the gain combination (i.e. the combination of the first signal gain and the second signal gain for the receiver circuit shown in FIG. 5) may be obtained. The first signal gain may have an allowable range that changes with the noise figure. Generally, the first signal gain may have a minimum value to make the noise figure less than a maximum value.

Accordingly, the threshold controller may determine the strength of the desired signal in the input signal according to the total gain of the amplifying chain, and further determine the noise figure required by the receiver circuit. Moreover, the threshold controller compares whether the present value of the first signal gain is smaller than the minimum value of the first signal threshold allowed by the required noise figure, and then determines whether or not to adjust the first threshold according to the comparison result. If the present value of the first threshold is larger than its allowable minimum value, then the first threshold may be decreased. Then the first threshold may be increased or decreased according to the ISR requirement. However, excess reduction of the first threshold should be restricted as the noise figure may increase to not satisfy the requirement of the receiver circuit. In contrast, if the present value of the first signal gain is smaller than its allowable minimum value, then the first threshold needs to be increased. The increased first threshold may lead to the increase of the first signal gain, which further lead to the decrease of the noise figure of the receiver circuit. After one or more adjustments, the first signal gain may be equal to or greater than its allowable minimum value corresponding to the noise figure, thereby satisfying the requirement of the receiver circuit on the noise figure.

Figure 7A:
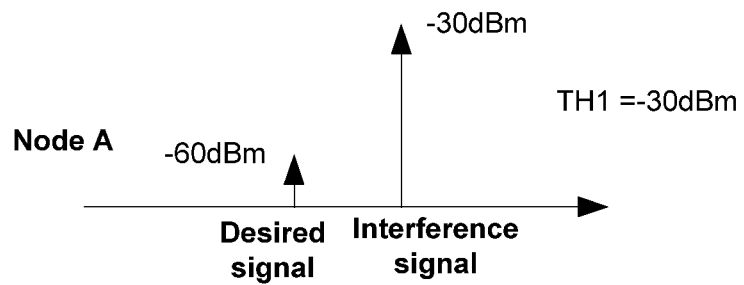
FIGS. 7a-7d show adjusting the first threshold to reduce distortion in the receiver circuit of FIG. 5.
Figure 7B:
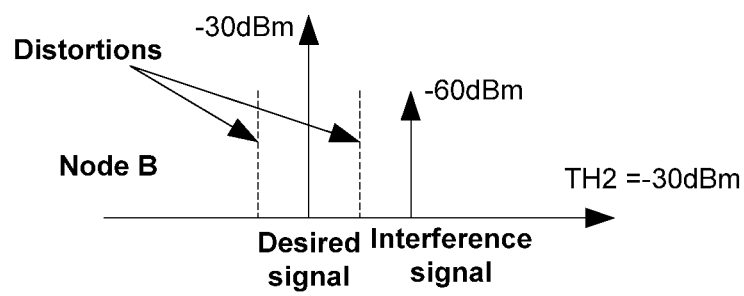
Figure 7C:
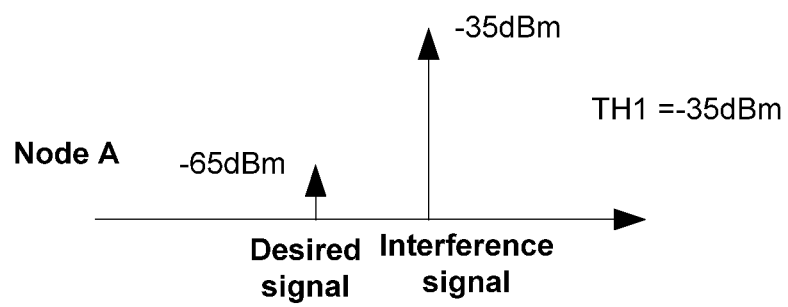
Figure 7D:
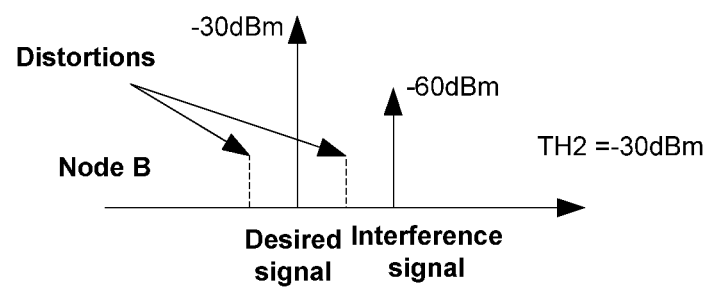

FIGS. 7*a*-7*d* show adjusting the first threshold to reduce distortion in the receiver circuit of FIG. 5. In particular, FIGS. 7*a* and 7*b* show power spectrums at node A (the first amplified signal) and node B (the second amplified signal) of the receiver circuit in FIG. 5 before the adjustment of the first threshold, while FIGS. 7*c* and 7*d* show power spectrums at node A and node B of the receiver circuit in FIG. 5 after the adjustment of the first threshold.

As shown in FIG. 7*a*, the first amplified signal $V_1$ at node A includes the desired signal and the interference signal, and its strength is maintained at the first threshold $TH_1$, i.e. −30 dBm. As the signal $V_1$ is not converted and filtered, the power of the interference signal generally exceeds that of the desired signal. Thus, the power of the interference signal is −30 dBm at node A.

As shown in FIG. 7*b*, the second amplified signal $V_2$ at node B, which has been converted and filtered, is maintained at the second threshold $TH_2$, i.e. −30 dBm. After the frequency conversion, the power of the interference signal is significantly depressed (filtered by the filter), thus the power of the desired signal at node B is −30 dBm.

Assuming that the first signal gain $SG_1$ is 20 dB and the second signal gain $SG_2$ is 30 dB, then the power of the desired signal at node A is equal to −30−30=−60 (dBm). As a result, the ISR of the first amplified signal $V_1$ at node A is −30−(−60)=30 (dB). The calculated ISR may be compared to a predetermined upper limit, and it may be found out that the ISR is too high (see FIG. 6), which indicates that the strength of the interference signal at node A is excessively high. An excessive high strength of the interference signal may influence the operation of the mixer and the filter and introduce high linearity requirement. Furthermore, an excessive high strength of the interference signal at node A may introduce excess distortion in the second amplified signal $V_2$ at node B, as is shown in FIG. 7b. The excess distortion in the second amplified signal $V_2$ may adversely influence the operation of the post-stage circuits of the receiver circuit.

As shown in FIGS. 7c and 7d, for the same input signal, if the first threshold $TH_1$ is decreased to −35 dBm and the second threshold $TH_2$ is maintained at −30 dBm, then the power of the desired signal at node B is still −30 dBm but the power of the interference signal at node A is decreased to −35 dBm. Under such condition, the total gain of the receiver circuit is still 50 dB, where the first signal gain $SG_1$ is 15 dB and the second signal gain $SG_2$ is 35 dB.

By comparing FIG. 7b with FIG. 7d, it can be found out that the strength reduction of the interference signal at node A loosens the linearity requirement of the mixer and the filter, thereby decreasing the strength of the interference signal at node B. This helps to increase the SNR of the second amplified signal $V_2$.

Figure 8A:
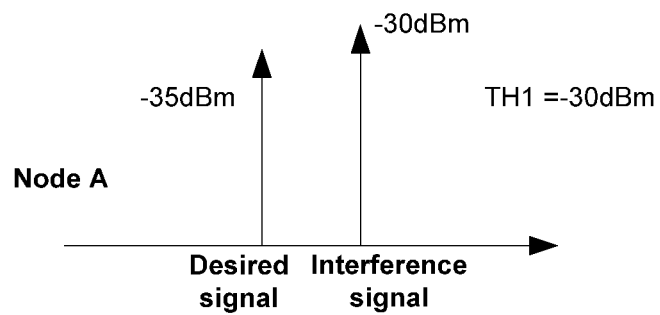
FIGS. 8a-8d show adjusting the first threshold to suppress noise in the receiver circuit of FIG. 5.
Figure 8B:
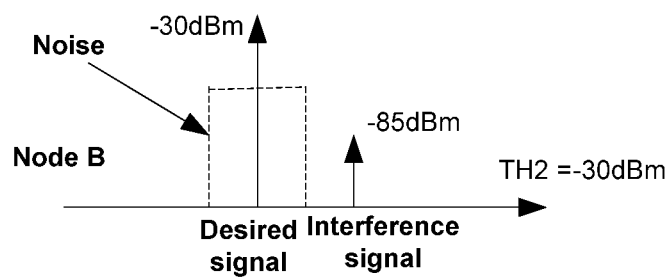

FIGS. 8a-8d show adjusting the first threshold to suppress noise in the receiver circuit of FIG. 5. In particular, FIGS. 8a and 8b show power spectrums at node A and node B of the receiver circuit in FIG. 5 before the adjustment of the first threshold, while FIGS. 7c and 7d show power spectrums at node A and node B of the receiver circuit in FIG. 5 after the adjustment of the first threshold.

As shown in FIG. 8a, the strength of the first amplified signal $V_1$ at node A is maintained at the first threshold $TH_1$, i.e. −30 dBm. As the power of the interference signal generally exceeds that of the desired signal, the power of the interference signal is −30 dBm at node A.

As shown in FIG. 8b, after being converted, the second amplified signal $V_2$ at node B is maintained at the second threshold $TH_2$, i.e. −30 dBm. As the power of the interference signal is significantly depressed, the power of the desired signal at node B is −30 dBm.

Assuming that the first signal gain $SG_1$ is 40 dB and the second signal gain $SG_2$ is 5 dB, then the power of the desired signal at node A is equal to −30−5=−35 (dBm). As a result, the ISR of the first amplified signal $V_1$ at node A is −30−(−35)=5 (dB). The calculated ISR may be compared to a predetermined lower limit, and it may be found out that the ISR is too low (see FIG. 6), which indicates that the strength of the interference signal at node A is excessively low and there is some linear margin on the first amplifying stage. Furthermore, appropriately increasing the first signal gain $SG_1$ may help to increase the strength of the desired signal at node A, thereby increasing the SNR of the second amplified signal $V_2$ at node B.

Figure 8C:
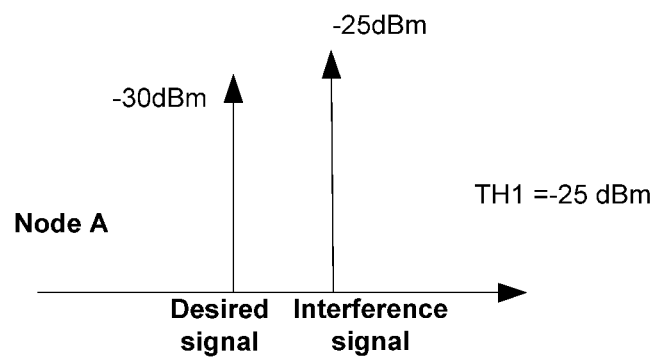
Figure 8D:
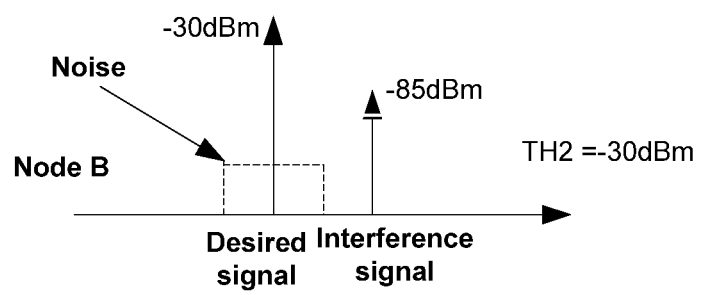

As shown in FIGS. 8c and 8d, for the same input signal, if the first threshold $TH_1$ is increased to −25 dBm and the second threshold $TH_2$ is maintained at −30 dBm, then the power of the desired signal at node B is −30 dBm but the power of the interference signal at node A is increased to −25 dBm. The power of the desired signal at node A is likewise increased, from −35 dBm to −30 dBm. Under such condition, the total gain of the receiver circuit is still 45 dB, herein the first signal gain $SG_1$ is 45 dB and the second signal gain $SG_2$ is 0 dB.

By comparing FIG. 8b with FIG. 8d, it can be found out that the power of the desired signal at node A increases while the noise introduced by the mixer and the filter is generally stable, thus the SNR of the second amplified signal $V_2$ increases due to the power increase of the first amplified signal $V_1$ at node A.

In certain embodiments, the receiver circuit 100 may adjust the first threshold $TH_1$ by adjusting the first reference signal $V_{Ref1}$. For example, the receiver circuit 100 may use a programmable signal generator to provide the first reference signal $V_{Ref1}$, and the signal generator may provide the first reference signal $V_{Ref1}$ with different strength in response to the first threshold control signal $V_{THCon1}$. Accordingly, the first feedback loop 109 may include the first signal detector 117 and the first gain controller 119 but not include the pre-amplifier 115. The signal detector 117 receives the variable first reference signal $V_{Ref1}$ provided by the signal generator and compares it with the first amplified signal $V_1$. The first threshold $TH_1$ at which the first amplified signal $V_1$ is maintained depends on the strength of the first reference signal $V_{Ref1}$.

For the receiver circuit according to embodiments of the application, the gain partitioning among various variable gain amplifiers can be implemented by adjusting the thresholds at nodes of the circuit, thereby the output signal of the receiver circuit may have a relatively good SNDR performance. The use of variable gain amplifiers increases the detectable power range of the signal detectors. The thresholds at the nodes being detected can be adjusted in a bigger range according to different input signal scenarios, thereby the signal chain may have a better dynamic range. Furthermore, the detector and gain controller coupled to each amplifying stage assure that the intermediate stage of the receiver circuit may not be saturated due to the interference signal filtered by the filter, thereby assuring the accuracy of the signal strength at each stage of the signal chain.

In certain conditions, the threshold at each node of the receiver circuits is adjusted by adjusting the detection gain of the pre-amplifier of the feedback loop. As the detection gain of the pre-amplifier can be adjusted very fast, the threshold adjustment can be fast.

Figure 9:
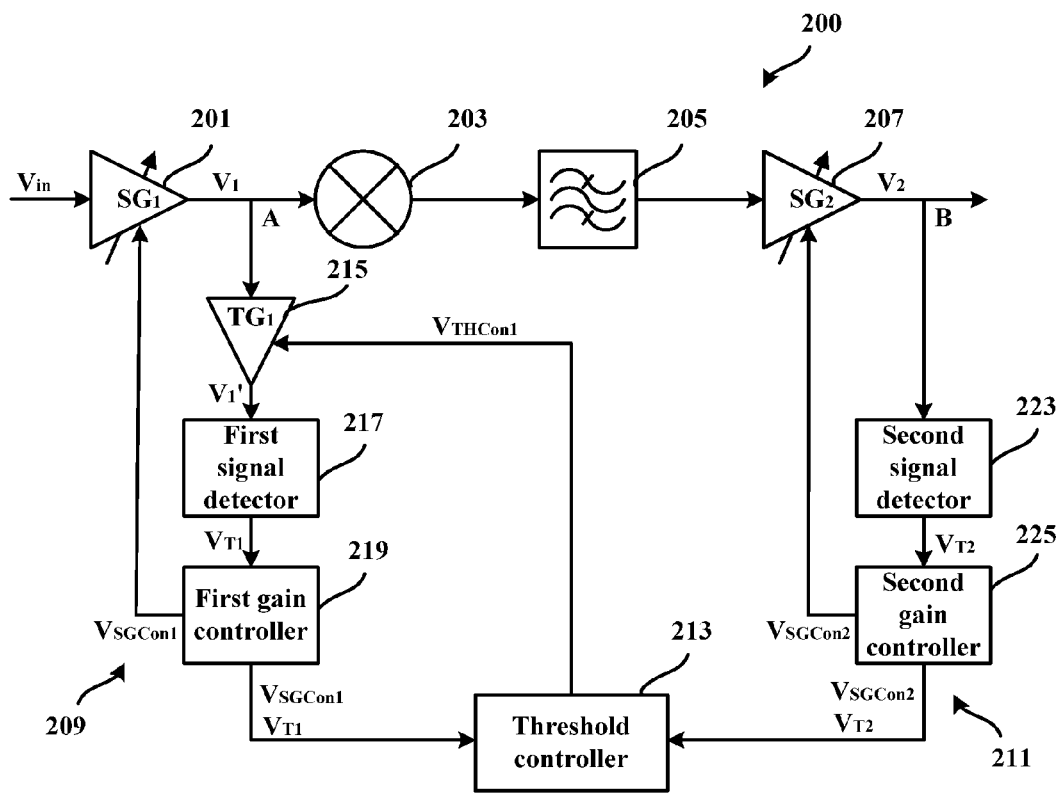
FIG. 9 shows a receiver circuit 200 according to an embodiment of the application.

FIG. 9 shows a receiver circuit 200 according to an embodiment of the application.

As shown in FIG. 9, the receiver circuit 200 includes a first amplifying stage 201, a mixer 203, a filter 205 and a second amplifying stage 207. Compared with the receiver circuit 100 shown in FIG. 5, a feedback loop 211 coupled to the second amplifying stage 207 includes only a second signal detector 223 and a second gain controller 225 but not include a pre-amplifier. Furthermore, the threshold controller 213 does not provide the threshold control signal for adjusting the second threshold to the second feedback loop 211. In another word, the second amplifying stage 207 coupled with the second feedback loop 211 forms a relatively independent AGC amplifier. The threshold controller 213 receives a second threshold (i.e. the strength of a second amplified signal $V_2$) and a second gain control signal, receives a first detection signal $V_{T1}$ provided by a first signal detector 217 in the first feedback loop 209 and a first gain control signal $V_{SGCon1}$, and generates a first threshold control signal $V_{THCon1}$ for setting a first threshold according to at least a portion of the received signals. In this way, the first threshold, i.e. the strength of the first amplified signal $V_1$, may be adjusted by changing the gain of the pre-amplifier 215.

In certain embodiments, for the variable gain amplifier(s) in the second amplifying stage 207, the gain control signal for controlling the second signal gain $SG_2$ may be provided by post-stage circuits such as a baseband circuit or a demodulation circuit. For example, the baseband circuit or the demodulation circuit may provide a gain control signal to a gain control node of the second amplifying stage 207 directly; or alternatively, the baseband circuit or demodulation circuit may provide the gain control signal to the second gain controller 225, which further applies the gain control signal to the second amplifying stage 207. Accordingly, the gain control signal may be provided to the threshold controller 213 for the determination of the second signal gain $SG_2$. Furthermore, the threshold controller 213 may determine the ISR of the first amplified signal $V_1$ according to the second signal gain of the second amplifying stage, the second detection signal and the first threshold, and further adjusts the first threshold according to a predetermined allowable ISR range corresponding to the first threshold.

Figure 10:
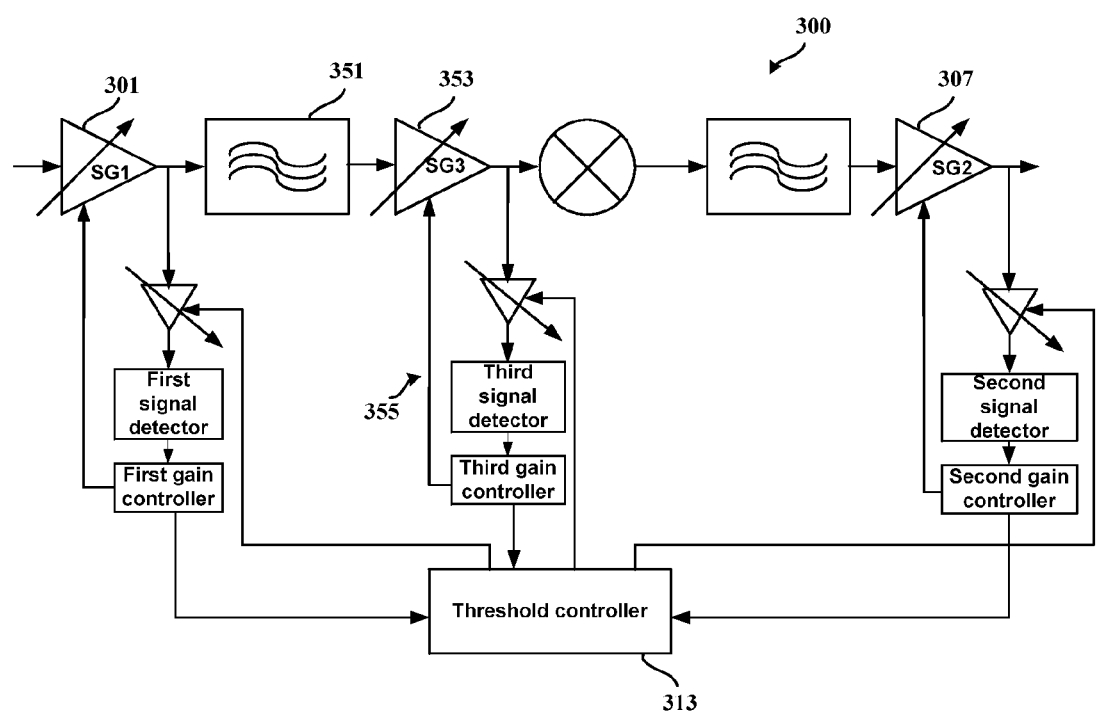
FIG. 10 shows a receiver circuit 300 according to an embodiment of the application.

FIG. 10 shows a receive circuit 300 according to an embodiments of the application.

As shown in FIG. 10, compared with the receiver circuit 100 shown in FIG. 5, the receiver circuit 300 further includes a filter 351 and a third amplifying stage 353 in front of a mixer. Similar to a first amplifying stage 301 and a second amplifying stage 307, the third amplifying stage 353 is coupled with a third feedback loop 355, which operates to maintain the strength of a third amplified signal at a third threshold. Accordingly, a threshold controller 313 is coupled to the third feedback loop 355 to generate a third threshold control signal for controlling the third threshold.

It would be appreciated that the receiver circuit 300 may operate in a manner similar to the receiver circuit 100 shown in FIG. 5, which will not be elaborated again herein. Moreover, in applications, a signal detector may be coupled to each intermediate node of the signal amplifying chain to detect the strength of signal at the intermediate node. The detection results of the signal strength may be provided to the threshold controller, so that the threshold controller may partition the gain among the amplifying stages according to the signal strength at the nodes, thereby improving the SNDR of the output signal of the receiver circuit.

Figure 11:
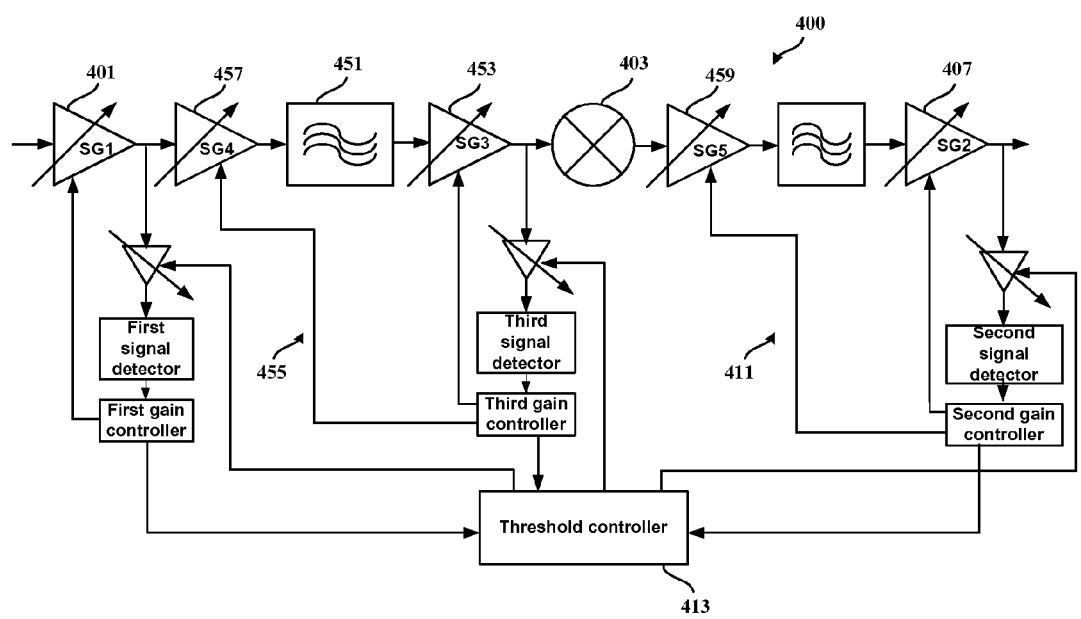
FIG. 11 shows a receiver circuit 400 according to an embodiment of the application.

FIG. 11 shows a receiver circuit 400 according to an embodiment of the application.

As shown in FIG. 11, compared with the receiver 100 shown in FIG. 5, the receiver circuit 400 further includes a filter 451 and a third amplifier 453 in front of a mixer 403, a fourth amplifier 457 in front of the filter 451, and a fifth amplifier 459 after the mixer 403. Similar to a first amplifier 401 and a second amplifier 407, the third amplifier 453 is coupled with a third feedback loop 455. Furthermore, the third feedback loop 455 provides a gain control signal to the fourth amplifier 457 to control its gain. The third feedback loop operates to maintain the strength of a third amplified signal output by the third amplifier 453 at a third threshold. Setting the third threshold appropriately may improve the SDNR of a second amplified signal output by the second amplifier 407. In certain embodiments, for the two amplifiers 453 and 457 coupled to the third feedback loop 455, the amplifier 457 may have better linearity and the amplifier 453 may have a bigger gain, which help to reduce the influence of the inherent noise of the filter 453 on the signal and improve the SNDR of the second amplified signal.

Similarly, a second feedback loop 411 of the receiver circuit 400 is coupled to the second amplifier 407 and the fifth amplifier 459 to provide gain control signal for controlling their gain. The second feedback loop 411 operates to maintain the strength of the second amplified signal output by the latter one of the second amplifier 407 and the fifth amplifier 459, i.e. the second amplifier 407, at the second threshold. In certain embodiments, for the two amplifiers 407 and 459 coupled to the second feedback loop 411, the amplifier 459 may have better linearity and the amplifier 407 may have a bigger gain.

Figure 12:
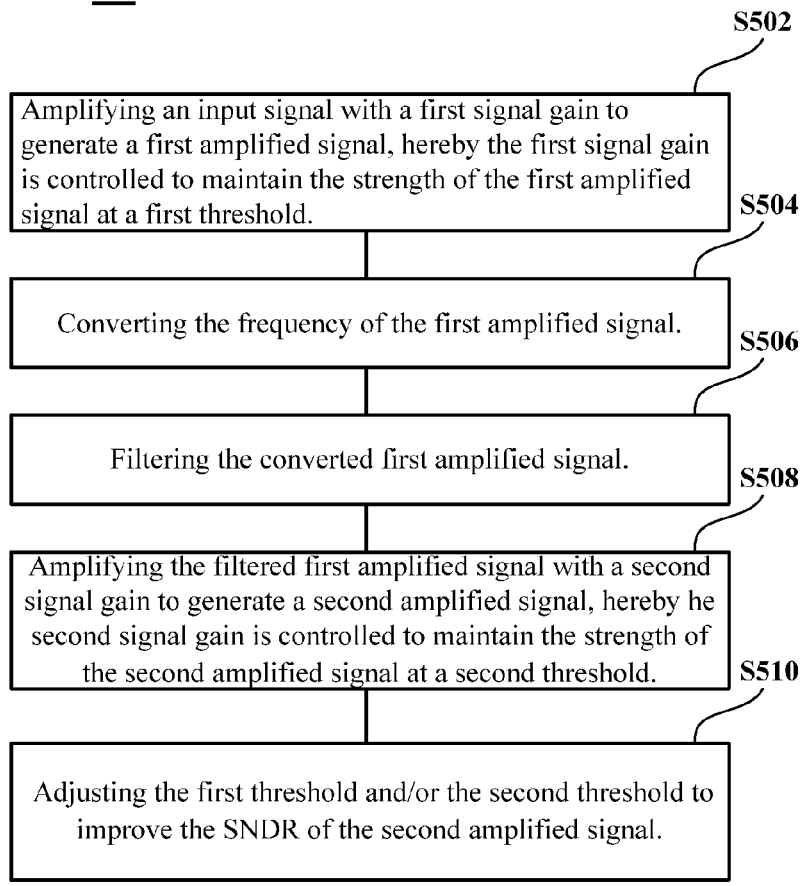
FIG. 12 shows a method 500 for controlling gain in a receiver circuit according to an embodiment of the application.

FIG. 12 shows a method 500 for controlling gain in a receiver circuit. The method may be implemented by the receiver circuits shown in FIGS. 5, 9, 10 and 11.

As shown in FIG. 12, the method starts with Step S502, an input signal is amplified with a first signal gain to generate a first amplified signal. The first signal gain is controlled to maintain the strength of the first amplified signal at a first threshold. Then at Step S504, the frequency of the first amplified signal is converted, and at Step S506, the converted first amplified signal is filtered. Afterwards, at Step S508, the filtered first amplified signal is amplified with a second signal gain to generate a second amplified signal. The second signal gain is controlled to maintain the strength of the second amplified signal at a second threshold. After that, at Step S510, the first threshold and/or the second threshold is adjusted to improve the SNDR of the second amplified signal.

In certain embodiments, adjusting the first threshold comprises: amplifying the first amplified signal with a first detection gain; detecting a ratio of the first amplified signal amplified with the first detection gain to a first reference signal; adjusting the first signal gain according to the detected ratio of the first amplified signal to the first reference signal; and adjusting the first detection gain to adjust the first threshold according to the first threshold, the second threshold and the second signal gain.

In certain embodiments, adjusting the first threshold comprises: detecting a ratio of the first amplified signal to a first reference signal; adjusting the first signal gain according to the detected ratio of the first amplified signal to the first reference signal; and adjusting the strength of the first reference signal to adjust the first threshold according to the first threshold, the second threshold and the second signal gain.

In certain embodiments, adjusting the first threshold further comprises: determining the ISR of the first amplified signal according to the first threshold, the second threshold and the second signal gain; adjusting the first threshold according to a predetermined allowable ISR range corresponding to the first threshold.

In certain embodiments, adjusting the first threshold according to the predetermined allowable ISR range corresponding to the first threshold comprises: decreasing the first threshold to reduce the interference in the second amplified signal when the ISR of the first amplified signal is higher than an upper limit of the allowable ISR range; and increasing the first threshold to improve the SNR of the second amplified signal when the ISR of the first amplified signal is lower than a lower limit of the allowable ISR range.

In certain embodiments, the method further comprises: determining a noise figure required by the receiver circuit and; and determining whether to adjust the first threshold according to an allowable range of the first signal gain corresponding to the noise figure.

In certain embodiments, the noise figure required by the receiver circuit is determined by the following equation:

$$NF = 174 \text{ dBm/Hz} - 10 * lg\, B - SNR_{out\,min} + P_{sig}$$

herein NF denotes the noise figure, B denotes the bandwidth of a desired signal, SNRoutmin denotes the minimum SNR that can be processed by a post stage circuit of the receiver circuit, Psig denotes the strength of the desired signal of the input signal, and herein Psig is determined by the first signal gain, the second signal gain and the second threshold.

Figure 13:
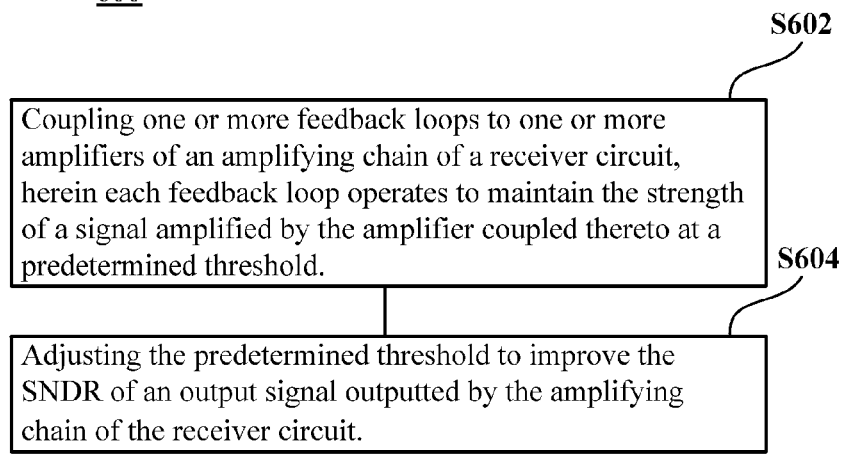
FIG. 13 shows a method 600 for controlling gain in a receiver circuit according to an embodiment of the application.

FIG. 13 shows a method 600 for controlling gain in a receiver circuit. The method 600 may be implemented by the receiver circuit shown in FIGS. 5, 9, 10 and 11.

As shown in FIG. 13, at Step S602, one or more feedback loops are coupled to one or more amplifiers of an amplifying chain of the receiver circuit, herein each feedback loop operates to maintain the strength of a signal amplified by the amplifier coupled thereto at a predetermined threshold. At Step S604, the predetermined threshold is adjusted to improve the SNDR of an output signal outputted by the amplifying chain of the receiver circuit. For example, the step of adjusting the predetermined threshold comprises: detecting the ISR of the amplified signal; and adjusting the predetermined threshold according to the detected ISR of the amplified signal.

It should be noted that although several modules or sub-modules of the receiver circuit have been described in the previous paragraphs, such division is exemplary and not mandatory. Practically, according to the embodiments of the present application, the functions and features of two or more modules described above may be embodied in one module. On the other hand, the function and feature of any one module described above may be embodied in two or more modules.

While the present application has been illustrated and described in detail in the drawings and foregoing description, such illustration and description are to be considered illustrative or exemplary and not restrictive; the present application is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope. The scope and spirit of the present application is defined by the appended claims.

What is claimed is:

1. A receiver circuit, comprising:
    a first amplifying stage having a first signal gain, the first amplifying stage being configured to receive an input signal and generate a first amplified signal;
    a mixer for converting the frequency of the first amplified signal;
    a filter for filtering the converted first amplified signal;
    a second amplifying stage having a second signal gain, the second amplifying stage being configured to receive the filtered first amplified signal and generate a second amplified signal;
    a first feedback loop coupled to the first amplifying stage and being configured to generate a first gain control signal for controlling the first signal gain according to the first amplified signal, wherein the first feedback loop operates to maintain the strength of the first amplified signal at a first threshold; and
    a threshold controller coupled to the first feedback loop, the threshold controller being configured to generate a first threshold control signal for adjusting the first threshold.

2. The receiver circuit of claim 1, wherein the first feedback loop comprises:
    a first pre-amplifier having a first detection gain and configured to amplify the first amplified signal;
    a first signal detector configured to receive a first reference signal and detect a ratio of the first amplified signal amplified by the first pre-amplifier to the first reference signal to generate a first detection signal;
    a first gain controller configured to generate the first gain control signal according to the first detection signal;
    wherein the threshold controller is configured to generate the first threshold control signal according to the first threshold, the strength of the second amplified signal and the second signal gain, and wherein the first threshold control signal adjusts the first detection gain to adjust the first threshold.

3. The receiver circuit of claim 2, wherein the threshold controller is configured to generate the first threshold control signal that increases the first detection gain to decrease the first threshold, and generate the first threshold control signal that decreases the first detection gain to increase the first threshold.

4. The receiver circuit of claim 1, wherein the first feedback loop comprises:
    a first signal detector configured to receive a first reference signal and detect a ratio of the first amplified signal to the first reference signal to generate a first detection signal;
    a first gain controller configured to generate a first gain control signal according to the first detection signal;
    wherein the threshold controller is configured to generate the first threshold control signal according to the first threshold, the strength of the second amplified signal and the second signal gain, and wherein the first threshold control signal adjusts the strength of the first reference signal to adjust the first threshold.

5. The receiver circuit of claim 4, wherein the threshold controller is configured to generate the first threshold control signal that decreases the strength of the first reference signal to decrease the first threshold, and generate the first threshold control signal that increases the first detection gain to increase the first threshold.

6. The receiver circuit of claim 1, wherein threshold controller is configured to adjust the first threshold to improve the signal to noise and distortion ratio (SNDR) of the second amplified signal.

7. The receiver circuit of claim 1, wherein the threshold controller is configured to determine the interference to signal ratio (ISR) of the first amplified signal, and adjust the first threshold according to a predetermined allowable ISR range corresponding to the first threshold.

8. The receiver circuit of claim 7, wherein the threshold controller is configured to decrease the first threshold to reduce the interference and distortion in the second amplified signal if the ISR of the first amplified signal is higher than an upper limit of the predetermined allowable ISR range, and increase the first threshold to increase the signal to noise ratio (SNR) of the second amplified signal if the ISR of the first amplified signal is lower than a lower limit of the predetermined allowable ISR range.

9. The receiver circuit of claim 7, wherein the threshold controller is configured to determine the ISR of the first amplified signal according to the first threshold, the strength of the second amplified signal and the second signal gain.

10. The receiver circuit of claim 7, wherein the threshold controller is further configured to determine the noise figure required by the receiver circuit, and determine whether to adjust the first threshold according to a predetermined allowable range of the first signal gain corresponding to the noise figure.

11. The receiver circuit of claim 10, wherein the noise figure required by the receiver circuit is determined by the following equation:

$$NF = 174\ dBm/Hz - 10*lg\ B - SNR_{out\ min} + P_{sig}$$

wherein NF denotes the noise figure, B denotes the bandwidth of a desired signal, $SNR_{outmin}$ denotes the minimum SNR that can be processed by a post stage circuit of the receiver circuit, Psig denotes the strength of the desired signal of the input signal, and wherein Psig is determined by the first signal gain, the second signal gain and the second threshold.

12. The receiver circuit of claim 1, wherein the receiver circuit further comprises:
a second feedback loop coupled to the second amplifier and being configured to generate a second gain control signal for controlling the second signal gain according to the second amplified signal, the second feedback loop operates to maintain the strength of the second amplified signal at a second threshold.

13. The receiver circuit of claim 12, wherein the threshold controller is further configured to determine the ISR of the first amplified signal according to the first threshold, the second threshold and the second gain control signal, and adjust the first threshold according to a predetermined allowable ISR range corresponding to the first threshold.

14. The receiver circuit of claim 13, wherein the threshold controller is configured to decrease the first threshold to reduce the interference and distortion in the second amplified signal if the ISR of the first amplified signal is higher than an upper limit of the predetermined allowable ISR range, and increase the first threshold to increase the SNR of the second amplified signal if the ISR of the first amplified signal is lower than a lower limit of the predetermined allowable ISR range.

15. A receiver circuit, comprising:
a first amplifying stage having one or more variable gain amplifiers, the first amplifying circuit being configured to receive an input signal and amplify the input signal;
a mixer configured to convert the frequency of the amplified signal amplified by the first amplifying stage;
a filter configured to filter the converted signal;
a second amplifying stage having one or more variable gain amplifiers, the second amplifying stage being configured to amplify the filtered signal;
one or more feedback loops, wherein each feedback loop is coupled to one or more of the one or more variable gain amplifiers of the first and second amplifying stages, and configured to generate a gain control signal for controlling the variable gain amplifiers coupled thereto according to an output signal outputted at a last amplifier of the one or more variable gain amplifiers coupled thereto, and wherein each feedback loop operates to maintain the strength of the output signal at a predetermined threshold; and
a threshold controller coupled to at least one of the one or more feedback loops and configured to generate a threshold control signal to adjust the predetermined threshold.

16. The receiver circuit of claim 15, wherein each feedback loop comprises:
a pre-amplifier having a detection gain and coupled to at the last amplifier of the one or more variable gain amplifiers coupled to the feedback loop, the pre-amplifier being configured to amplify the output signal amplified by the one or more variable gain amplifiers coupled to the feedback loop;
a signal detector configured to receive a reference signal, and configured to detect a ratio of a signal amplified by the pre-amplifier to the reference signal to generate a detection signal;
a gain controller configured to generate the gain control signal according to the detection signal;
wherein the threshold controller is configured to generate the threshold control signal according to the predetermined threshold and the gain control signal, and wherein the threshold control signal adjusts the detection gain to adjust the predetermined threshold.

17. The receiver circuit of claim 16, wherein the threshold controller is configured to generate the threshold control signal that increases the detection gain to decrease the predetermined threshold, and generate the threshold control signal that decreases the detection gain to increase the predetermined threshold.

18. The receiver circuit of claim 15, wherein each feedback loop comprises:
a signal detector configured to receive a reference signal, and configured to detect a ratio of the output signal amplified by the one or more variable gain amplifiers coupled to the feedback loop to the reference signal to generate a detection signal;
a gain controller configured to generate the gain control signal according to the detection signal;
wherein the threshold controller is configured to generate the threshold control signal according to the predetermined threshold and the gain control signal, and wherein the threshold control signal adjusts the strength of the reference signal to adjust the predetermined threshold.

19. The receiver circuit of claim 18, wherein the threshold controller is configured to generate the threshold control signal that decreases the strength of the reference signal to decrease the predetermined threshold, and generate the threshold control signal that increases the strength of the reference signal to increase the predetermined threshold.

20. The receiver circuit of claim 15, wherein the threshold controller is further configured to adjust the predetermined threshold corresponding to the first amplifying stage to increase the SNDR of the signal amplified by the second amplifying stage.

21. The receiver circuit of claim 15, wherein the threshold controller is configured to determine the SNR of the signal amplified by the first amplifying stage, and adjust the predetermined threshold corresponding to the signal amplified by the first amplifying stage according to a predetermined allowable ISR range corresponding to the predetermined threshold.

22. The receiver circuit of claim 21, wherein the threshold controller is configured to decrease the predetermined threshold to reduce the interference and distortion in the signal amplified by the second amplifying stage if the ISR of the signal amplified by the first amplifying stage is higher than an upper limit of the predetermined allowable ISR range, and increase the predetermined threshold to increase the SNR of the signal amplified by the second amplifying stage if the ISR of the signal amplified by the first amplifying stage is lower than a lower limit of the predetermined allowable ISR range.

23. A method, performed by a receiver circuit, for controlling gain in the receiver circuit, comprising:
amplifying an input signal with a first signal gain to generate a first amplified signal, wherein the first signal gain is controlled to maintain the strength of the first amplified signal at a first threshold;
converting the frequency of the first amplified signal;
filtering the converted first amplified signal;
amplifying the filtered first amplified signal with a second signal gain to generate a second amplified signal, wherein the second signal gain is controlled to maintain the strength of the second amplified signal at a second threshold; and adjusting the first threshold and/or the second threshold to improve the SNDR of the second amplified signal.

24. The method of claim 23, wherein adjusting the first threshold comprises:
   amplifying the first amplified signal with a first detection gain;
   detecting a ratio of the first amplified signal amplified with the first detection gain to a first reference signal;
   adjusting the first signal gain according to the detected ratio of the first amplified signal amplified with the first detection gain to the first reference signal;
   adjusting the first detection gain to adjust the first threshold according to the first threshold, the second threshold and the second signal gain.

25. The method of claim 23, wherein adjusting the first threshold comprises:
   detecting a ratio of the first amplified signal to a first reference signal;
   adjusting the first signal gain according to the detected ratio of the first amplified signal to the first reference signal;
   adjusting the strength of the first reference signal to adjust the first threshold according to the first threshold, the second threshold and the second signal gain.

26. The method of claim 24, wherein adjusting the first threshold further comprises:
   determining the ISR of the first amplified signal according to the first threshold, the second threshold and the second signal gain;
   adjusting the first threshold according to a predetermined allowable ISR range corresponding to the first threshold.

27. The method of claim 26, wherein adjusting the first threshold according to the predetermined allowable ISR range corresponding to the first threshold comprises:
   decreasing the first threshold to reduce the interference and distortion in the second amplified signal when the ISR of the first amplified signal is higher than an upper limit of the predetermined allowable ISR range; and
   increasing the first threshold to improve the SNR of the second amplified signal when the ISR of the first amplified signal is lower than a lower limit of the predetermined allowable ISR range.

28. The method of claim 26, further comprising:
   determining a noise figure required by the receiver circuit and; and
   determining whether to adjust the first threshold according to a predetermined allowable range of the first signal gain corresponding to the noise figure.

29. The method of claim 28, wherein the noise figure required by the receiver circuit is determined by the following equation:

$$NF=174 \text{ dBm/Hz}-10*lg\, B-SNR_{out\ min}+P_{sig}$$

wherein NF denotes the noise figure, B denotes the bandwidth of a desired signal, $SNR_{outmin}$ denotes the minimum SNR that can be processed by a post stage circuit of the receiver circuit, Psig denotes the strength of the desired signal of the input signal, and wherein Psig is determined by the first signal gain, the second signal gain and the second threshold.

* * * * *